United States Patent [19]

Haas et al.

[11] 4,119,441

[45] Oct. 10, 1978

[54] METHOD FOR THE PRODUCTION OF N-DOPED SILICON WITH A DISH-SHAPED PROFILE OF SPECIFIC RESISTANCE IN A RADIAL DIRECTION

[75] Inventors: Ernst Haas, Erlangen; Karl Platzoeder; Manfred Schnoeller, both of Haimhaussen, all of Germany

[73] Assignee: Siemens Aktiengesellschaft, Berlin & Munich, Germany

[21] Appl. No.: 731,440

[22] Filed: Oct. 12, 1976

[30] Foreign Application Priority Data

Nov. 24, 1975 [DE] Fed. Rep. of Germany ....... 2552621

[51] Int. Cl.$^2$ .......................................... H01L 21/263
[52] U.S. Cl. ...................................... 148/1.5; 176/10; 357/38; 357/91
[58] Field of Search ........................ 250/492 R, 492 A; 176/10, 11; 148/1.5

[56] References Cited

U.S. PATENT DOCUMENTS

| | | | |
|---|---|---|---|
| 3,255,050 | 6/1966 | Klahr | 148/1.5 |
| 3,967,982 | 7/1976 | Arndt et al. | 148/1.5 |

OTHER PUBLICATIONS

C. N. Kahr et al., "Neutron Transmutation Doped Semi-Conductors", Nuceonics, 22, (1964) 62.
S. M. Sze et al., "... Junction Curvature on Breakdown Voltage . . . . ", Solid-State-Electronics, 9 (1966) 831.
Sh. M. Mirianashivili et al., "Transmutation Doping of GaAs", Sov. Phys. – Semiconductors, 4 (1971) 1612.

*Primary Examiner*—L. Dewayne Rutledge
*Assistant Examiner*—Upendra Roy
*Attorney, Agent, or Firm*—Hill, Gross, Simpson, Van Santen, Steadman, Chiara & Simpson

[57] ABSTRACT

A method is disclosed for the production of n-doped silicon single crystals, each having a dish-shaped specific electrical resistance profile in a radial direction about a central axis of the crystal. A silicon single crystal is exposed to a pattern of radiation with neutrons according to the reaction $30_{Si}$ (n,$\gamma$) $31_{Si}{}^\beta \rightarrow 31_P$. The neutron radiation causes a weaker doping concentration in marginal regions of the crystals due to the production of fewer phosphorus atoms. Either p-conductive silicon crystals or n-conductive silicon crystals may be utilized as an initial material for exposure to the neutron radiation.

9 Claims, 11 Drawing Figures

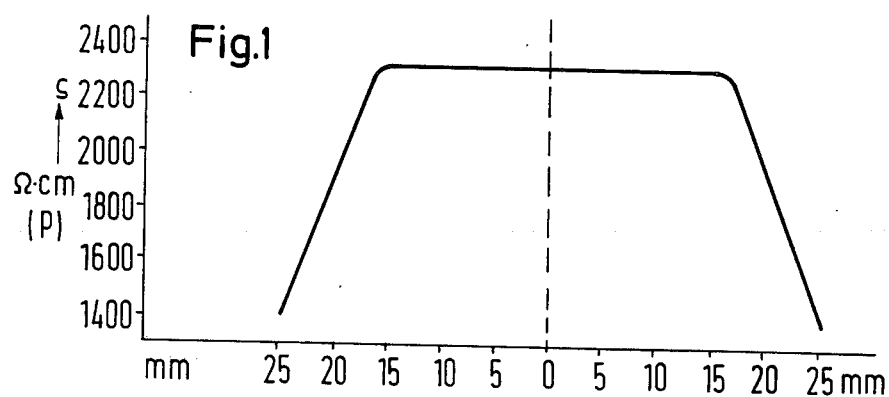
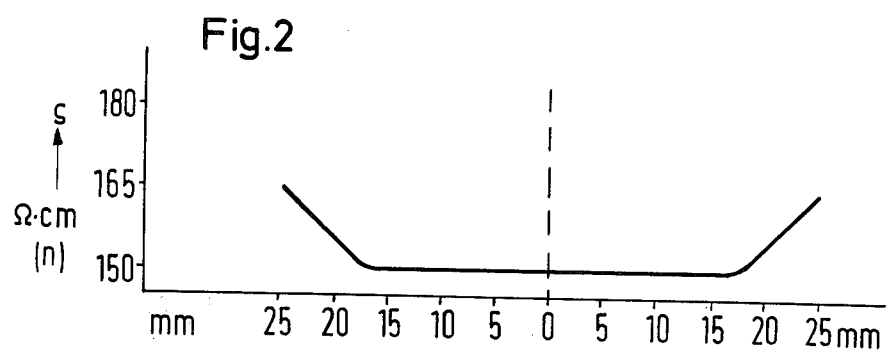
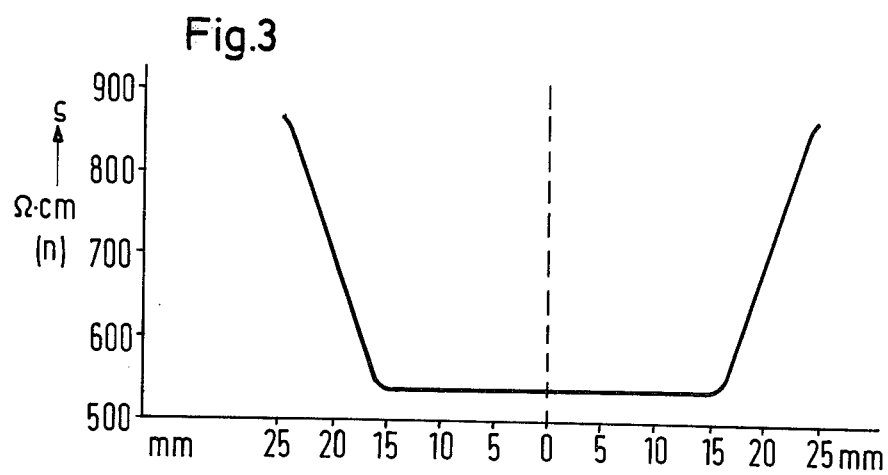

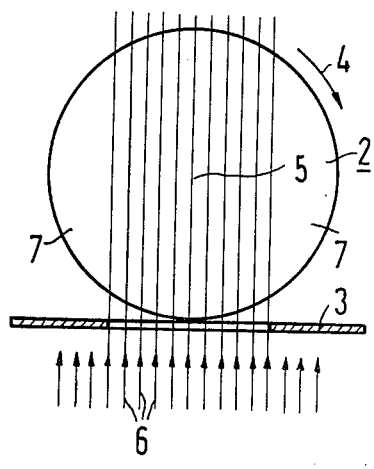
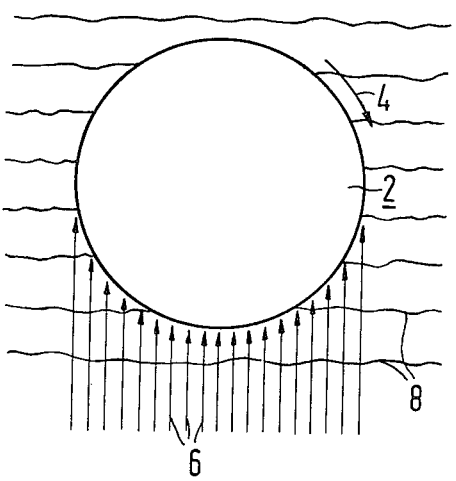
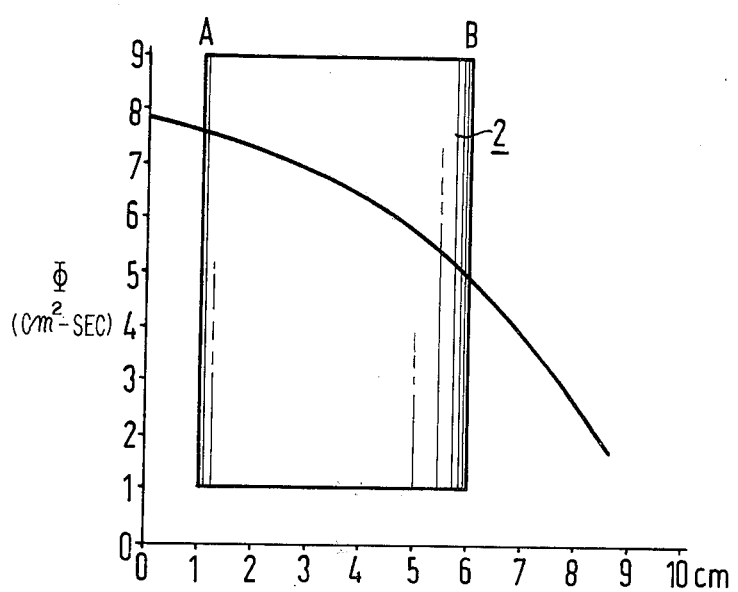

METHOD FOR THE PRODUCTION OF N-DOPED SILICON WITH A DISH-SHAPED PROFILE OF SPECIFIC RESISTANCE IN A RADIAL DIRECTION

BACKGROUND OF THE INVENTION

1. Field of the Invention

The present invention relates to a method for the production of n-doped silicon crystals having a dish-shaped profile of specific electrical resistance ($\rho$) in a radial direction.

2. Description of the Prior Art

It is generally desirable to produce silicon single crystal rods for the production of semiconductor component elements. Such rods have very even resistance values with respect to radial resistance paths, i.e., the doped-material distribution is provided as homogeneous as possible over the entire cross section of the silicon crystal rod.

Silicon crystals which have a homogeneous specific resistance path $\rho$ in the disc center and which have a directional increase of the specific electric resistance ($\rho$) towards the disc outer margin (dish-shaped $\rho$ profile of the silicon crystal disc) are desirable for the production of special semiconductor component elements such as large-surface, high blocking power thyristors. In such devices it is desirable to displace the avalanche breakthrough from the disc edge or margin to the disc center. This means that the doping material distribution in the radial direction is lower in the margin regions of a crystal disc than in the center regions.

SUMMARY OF THE INVENTION

It is an object of the present invention to produce silicon crystals having a dish-shaped specific resistance profile.

An article by Tanenbaum and Mills in the magazine "J. Electrochem. Soc." 108, (1961), pages 171–176 teaches that silicon crystals with homogeneous n-type conductivity can be produced by way of thermal-neutron radiation. The natural isotope $^{30}$Si, which is present in the silicon, is converted into the unstable isotope $^{31}$Si, while receiving a thermal neutron and emitting $\gamma$ radiation such that this unstable isotope $^{31}$Si changes into the stable phosphorus isotope $^{31}$P with a half-life time of 2.62 hours, while emitting $\beta^-$ radiation. In the case of the so-called radioactive doping of the silicon in accordance with the reaction

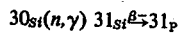

the following relationship is valid, presuming that $^{31}$Si has leveled off entirely and the $^{30}$Si residue is negligibly small:

$$C_P = 2.0 \times 10^{-4} \cdot I \cdot t$$

where $C_P$ = phosphorus concentration in atoms/cm$^3$,
$I$ = thermal neutron flow in neutrons/cm$^2$ · sec., and
$t$ = radiation time in seconds.

The invention utilizes this relationship and solves the problem of producing n-doped silicon single crystals having a dish-shaped specific resistance ($\rho$) profile in the radial direction. According to the invention, the silicon single crystals are exposed to a neutron radiation in accordance with the known reaction

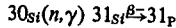

to such an extent that a weaker doped-material concentration is present at marginal regions than at the center of the silicon crystal due to the production of fewer phosphorus atoms.

BRIEF DESCRIPTION OF THE DRAWINGS

FIG. 1 is a graph illustrating a specific electrical resistance profile in a p-conductive silicon crystal prior to neutron radiation treatment;

FIG. 2 is a graph illustrating the profile of specific electrical resistance in a doped silicon crystal after treating with neutron radiation in accordance with the invention;

FIG. 3 is a graph illustrating the profile of specific electrical resistance in an n-conductive silicon crystal prior to neutron radiation treatment;

FIG. 4 is a plan view of a device of the invention for controlling the exposure of a silicon crystal rod to neutron radiation; and FIGS. 5, 6, 7, 8, 9, 10 and 11 are alternate embodiments of devices for controlling the exposure of silicon crystals to neutron radiation.

DESCRIPTION OF THE PREFERRED EMBODIMENTS

Figure 7:
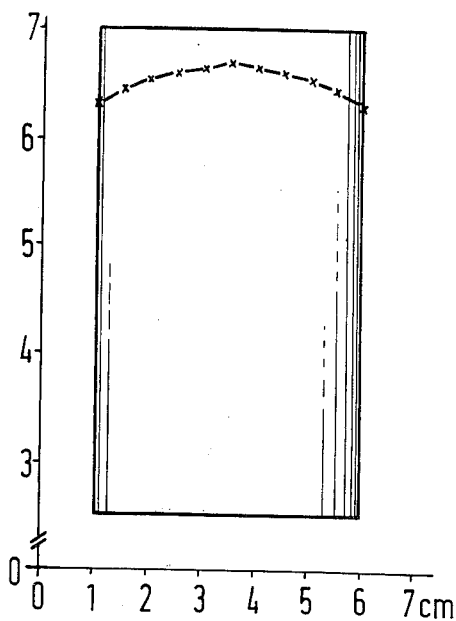

A p-conductive silicon crystal is used as the initial material for the neutron radiation. The crystal has a region of elevated specific electric resistance at its center (see FIG. 1). Due to the entering neutron radiation, an inverse donator profile is produced from the acceptor profile with a "$\rho$-hump", whereby the less doped silicon, which was originally provided with acceptors, is first placed into an n-doped state, and the stronger doped material later converts into n-conductive silicon (see FIG. 2).

However, it is also within the framework of the present invention that the initial material for the neutron radiation is an n-conductive silicon crystal which, in a radial direction, has a region of low specific resistance at its center (see FIG. 3). In such a case, due to the entering neutron radiation, the $\rho$-profile of the initial material is flattened more when the doping-material concentration in the initial material is lower compared to the amount of radioactive phosphorus concentration. Again, the $\rho$-profile as shown in FIG. 2 is produced. The broken line shown vertical in FIGS. 1 through 3 indicates the crystal disc center.

According to the teachings of this invention, the dish-shaped $\rho$-profile is either produced by way of partial absorption or by way of partial moderation of the neutron radiation. Therefore, care must be used that a neutron depression occurs simultaneously with a neutron absorption.

Referring now to FIGS. 4 through 11, the behavior of a silicon rod in a neutron field modified by different methods of the invention will be explained.

As shown in FIG. 4, a slot-shaped screen 3 may be placed before a vertically mounted silicon crystal rod 2 during the neutron radiation and the crystal 2 is rotated around its longitudinal axis (see arrow 4). A screen 3 made of cadmium sheet metal of, for instance, 1 mm thickness, or of boron glass, and having an adjustable slot width may be used. When the silicon rod 2 is rotated, the center portions 5 are continuously positioned in front of the parallel neutron beam (see arrow 6). The marginal regions 7 of the rod 2 are less exposed to radiation since they are only influenced by the dispersed and diffused neutrons. This causes an increased resistance of the silicon, as shown in FIG. 2. Therefore, the $p$-profile depends on the adjusted screen width. The entering neutrons are almost entirely absorbed by the cadmium sheet of 1 mm thickness.

In the second embodiment shown in FIG. 5, the neutron radiation 6 of the silicon crystal 2 is performed within a reactor of, for example, a swimming-pool type (not shown) for producing a neutron radiation flux gradient, and the crystal rod 2 is rotated around its longitudinal axis (see arrow 4). The part of the neutron beam 6 which must travel longer paths within the water 8 is weakened in intensity. During the rotation, a rotation-symmetric $p$ profile is obtained in which $p$ increases in the outer regions (see FIG. 2).

FIG. 6 shows a neutron flux path in a silicon rod 2 in a neutron field with a non-linear flux gradient. There, the distance of the silicon rod from a hot rod surface, in cm, is shown as the abscissa ($x$ axis), and the relative concentration of emitted thermal neutrons $\Phi(cm^2\text{-sec})$ as the ordinate ($y$ axis).

FIG. 7 illustrates the relative phosphorus concentration path in the silicon rod 2 obtained with the method and apparatus of FIG. 6. This concentration path appears in the silicon rod 2 over the rod cross section when the silicon rod 2 is exposed to radiation for an equal time in positions AB and BA (after half of the radiation time, the rod 2 is rotated around 180°). The relative phosphorus concentration is shown as the ordinate, and the silicon-rod diameter as the abscissa.

In a further development of the concept of the invention, the dish-shaped $p$-profile may be produced by way of controlled deflection of a particle beam consisting of fast neutrons onto a sandwich made of a silicon crystal and of a target. With such a method, the target is constructed as a moderator. The $p$-profile is produced in such a way that a lesser moderation is effected at the margin regions due to the geometry of the target. The target may, for instance, consist of parafin, graphite, or also of heavy water.

Figure 8:
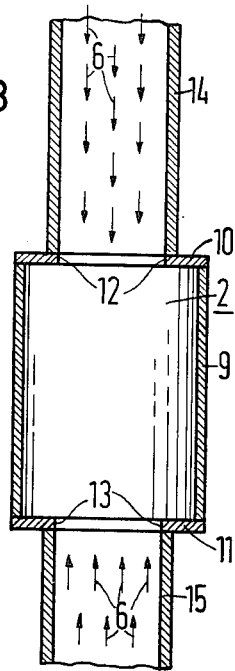

It is furthermore within the concept of the invention that, as shown in FIG. 8, the crystal 2 which is to be exposed to radiation is encased by a material 9 which is at least partially neutron-absorbing. The crystal 2 is covered at its frontal surfaces with at least one partially neutron-absorbing disc 10 or 11, which respectively form an opening 12 or 13 in the center which corresponds to the desired $p$-profile. Boron glass, boron carbide, boron nitride, cadmium oxide and cadmium sheet metal are used as neutron-absorbing material. It is also possible to use plastics such as polyethylene supplemented by a gadolinium compound, or silicon rubber applied onto the corresponding surface.

For carrying out this method, a device (FIG. 8) is suggested in accordance with the teaching of the invention which has a tube 9 made of boron glass or cadmium sheet metal, the tube being open on both sides and adapted to the diameter and length of the crystal rod 2 which is to be exposed to radiation. Cadmium or bornglass discs 10, 11 are also provided which are attached to the two tube openings and which are provided with an opening (12, 13) in their center. Finally, aperture tubes 14 and 15, adapted to the opening diameter of the absorption discs 10 and 11 and made of cadmium sheet metal or boron glass, are arranged between the neutron source (6) and the absorption discs 10 and 11. The formation of the $p$-profile is influenced by the different lengths of the aperture tubes 14 and 15, by their inner diameters, and by the different wall thicknesses of the absorption material. This arrangement (FIG. 8) is placed into a reactor, which has not been shown in the figure, in order to produce the phosphorus doping by entering neutrons.

Figure 9:
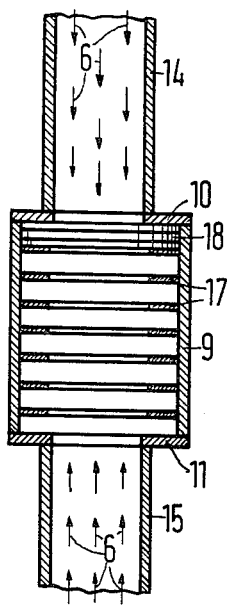

In accordance with FIG. 9, the device shown in FIG. 8 can be changed in such a way that the tube 9, which is open on both ends, is constructed to retain stacked groups of silicon discs 18 for radiation (only one chamber being shown filled in the drawing). Rings 17 made of neutron-absorbing material may be placed at corresponding spacings within the inner surface of the tube 9 as carriers for the crystal discs 18. The material used for the rings 17 may have a higher absorption coefficient for neutrons than the tube material. In this manner, a screen effect is increased.

By way of varying the geometry of the absorption parts, the production of phosphorus atoms may be additionally varied. In the case of absorption thicknesses of, for instance, 1 mm cadmium sheet metal, the thermal portions of the neutron flow can be decreased to less than 1/10,000.

Figure 10:
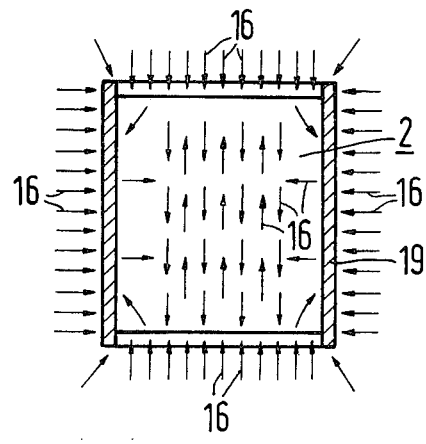

FIG. 10 shows a further method and apparatus for exposing the silicon crystal 2 to radiation in the reactor. There, the silicon crystal 2 has its circumferential surface enclosed by a neutron-absorbing material 19 consisting of boron glass, gadolinium lacquer, boron carbide, boron nitride, cadmium sheet metal, or cadmium oxide, which is inserted into the nuclear reactor (not shown in the figure). The arrows 16 shown in the figure illustrate the neutron radiation occuring in the area of the crystal and within the crystal itself. As can be seen from FIG. 10, the radiation is weaker in the marginal regions of the crystal, so that an increase of the phosphorus concentration results in the center crystal portions (compare FIG. 2).

Figure 11:
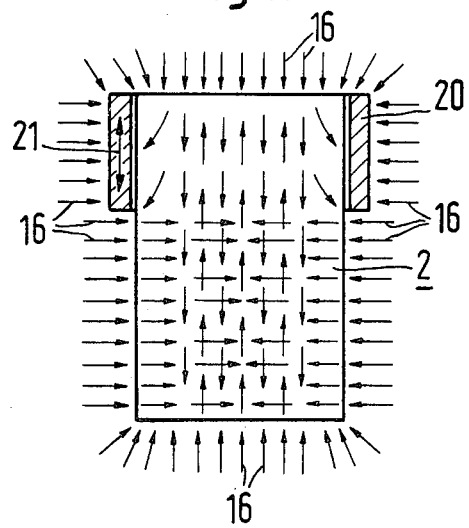

FIG. 11 shows a further variation of the method in accordance with the invention, whereby an absorption sleeve 20 can be evenly moved along the rod 2 (see arrow 21). Therefore, the $p$-profile can be changed via the length of the sleeve 20. The absorption sleeve 20 which, for instance, consists of cadmium sheet metal of 1 mm thickness, is shifted during the radiation along the crystal rod 2 in such a way that each region of the sleeve surface of the rod 22 remains covered by the absorption sleeve 20 for equal time intervals. Since each marginal region of the silicon crystal 2 obtains the same radiation in the cae of an even movement of the absorption sleeve 20 along the rod 2, the desired dish-shaped $p$-profile (see FIG. 2) will result. However, it is just as possible to shift the silicon rod 2 during the neutron radiation instead of the absorption sleeve 20.

It is also possible to first expose the silicon crystal which is to be doped to homogeneous neutron radiation and only then to apply radiation in accordance with the teaching of the invention.

Although various minor modifications may be suggested by those versed in the art, it should be understood that we wish to embody within the scope of the patent warranted hereon, all such embodiments as reasonably and properly come within the scope of the our contribution to the art.

We claim as our invention:

1. A method for the production of an n-doped silicon single crystal having a dish-shaped specific electrical resistance profile in a radial direction about a central axis of the crystal comprising the step of exposing a silicon single crystal to a pattern of radiation with neutrons in accordance with the reaction

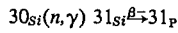

to such an extent that a weaker doping-material concentration is present in marginal regions of the crystal due to the production of fewer hosphorus atoms and wherein a p-conductive silicon crystal is used as initial material for exposure to the neutron radiation, said p-conductive silicon crystal having a region of elevated specific electric resistance at central portions.

2. A method for the production of an n-doped silicon single crystal having a dish-shaped specific electrical resistance profile in a radial direction about a central axis of the crystal, comprising the step of exposing a silicon single crystal to a pattern of radiation with neutrons in accordance with the reaction

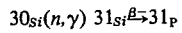

to such an extent that a weaker doping-material concentration is present in marginal regions of the crystal due to the production of fewer phosphorus atoms and wherein a n-conductive silicon crystal is used as an initial material for the neutron radiation, said n-conductive silicon crystal having a region of low specific resistance at central portions.

3. A method for the production of an n-doped silicon single crystal having a dish-shaped specific electrical resistance profile in a radial direction about a central axis of the crystal, comprising the step of exposing a silicon single crystal to a pattern of radiation with neutrons in accordance with the reaction

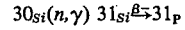

to such an extent that a weaker doping-material concentration is present in marginal regions of the crystal due to the production of fewer phosphorus atoms, the dish-shaped specific resistance profile being produced by way of partial absorption of the neutron radiation, and includling the steps of placing a slot-shaped screen whose slot width can be adjusted in front of the silicon crystal during the neutron radiation and rotating the crystal around its central axis.

4. A method in accordance with claim 3, characterized in that the screen is made of cadmium sheet metal of 1 mm thickness.

5. A method in accordance with claim 3, in which the screen is made of boron glass.

6. A method for the production of an n-doped silicon single crystal having a dish-shaped specific electrical resistance profile in a radial direction about a central axis of the crystal, comprising the step of exposing a silicon single crystal to a pattern of radiation with neutrons in accordance with the reaction

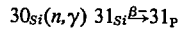

to such an extent that a weaker doping-material concentration is present in marginal regions of the crystal due to the production of fewer phosphorus atoms, the dish-shaped specific resistance profile being produced by way of partial moderation of the neutron radiation, and including the steps of performing the neutron radiation of the silicon crystal in a reactor in a region with a non-linear radiation flux gradient, and rotating the crystal rod around its longitudinal axis.

7. A method for the production of an n-doped silicon single crystal having a dish-shaped specific electrical resistance profile in a radial direction about a central axis of the crystal, comprising the step of exposing a silicon single crystal to a pattern of radiation with neutrons in accordance with the reaction

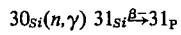

to such an extent that a weaker doping-material concentration is present in marginal regions of the crystal due to the production of fewer phosphorus atoms and wherein the dish-shaped specific resistance profile is produced by way of controlled deflection of a particle beam, consisting of fast neutrons, onto a sandwich made of the silicon crystal and a target, a lesser moderation occurring at margin regions of the crystal due to geometry of the target.

8. A method for the production of an n-doped silicon single crystal having a dish-shaped specific electrical resistance profile in a radial direction about a central axis of the crystal, comprising the steps of exposing a silicon single crystal to a pattern of radiation with neutrons in accordance with the reaction

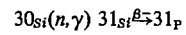

to such an extent that a weaker doping-material concentration is present in marginal regions of the crystal due to the production of fewer phosphorus atoms, effecting the radiation in a nuclear reactor, and encasing the circumferential surface of the crystal which is to be exposed to radiation with an at least partially neutron-absorbing material, and covering its frontal surfaces with at least partially neutron-absorbing discs which comprise openings corresponding in the center to the desired specific resistance profile.

9. A method in accordance with claim 8 in which the neutron-absorbing material is selected from a group consisting of boron glass, cadmium sheet metal, boron carbide, boron nitride, cadmium oxide, a plastic provided with a gadolinium compound, and a plastic provided with silicon rubber.

* * * * *